(12) United States Patent
Hsiao et al.

(10) Patent No.: US 11,523,538 B2
(45) Date of Patent: Dec. 6, 2022

(54) CONNECTOR WITH HIGH HEAT DISSIPATION EFFICIENCY

(71) Applicant: BIZLINK INTERNATIONAL CORPORATION, New Taipei (TW)

(72) Inventors: Hsin-Tuan Hsiao, New Taipei (TW); Jui-Hung Chien, New Taipei (TW)

(73) Assignee: BIZLINK INTERNATIONAL CORPORATION, New Taipei (TW)

( * ) Notice: Subject to any disclaimer, the term of this patent is extended or adjusted under 35 U.S.C. 154(b) by 138 days.

(21) Appl. No.: 17/099,041

(22) Filed: Nov. 16, 2020

(65) Prior Publication Data

US 2021/0227717 A1 Jul. 22, 2021

(30) Foreign Application Priority Data

Jan. 16, 2020 (TW) ................................ 109200645

(51) Int. Cl.
*H05K 7/20* (2006.01)
*H01R 12/72* (2011.01)

(52) U.S. Cl.
CPC ......... *H05K 7/2039* (2013.01); *H01R 12/722* (2013.01)

(58) Field of Classification Search
CPC ... G02B 6/4292; H05K 7/2039; H01R 12/722
See application file for complete search history.

(56) References Cited

U.S. PATENT DOCUMENTS

| 10,617,034 B2 * | 4/2020 | Hubahib Gaviola ........................ H05K 5/0004 |
| 2021/0072473 A1 * | 3/2021 | Wall, Jr. ............... H05K 1/0274 |

\* cited by examiner

*Primary Examiner* — Briggitte R. Hammond
(74) *Attorney, Agent, or Firm* — Rabin & Berdo, P.C.

(57) ABSTRACT

A connector has a case, a circuit board, and a thermal diffusing unit. The case has an inner surface. The circuit board is mounted in the case and has a heating source. The thermal diffusing unit abuts the inner surface of the case and the heating source of the circuit board. An area of the thermal diffusing unit abutting the inner surface is bigger than an area of the thermal diffusing unit abutting the heating source. A heat transfer coefficient of the thermal diffusing unit is bigger than a heat transfer coefficient of the case. With the structure above, the thermal diffusing unit is allowed to transmit heat from a small area to a big area, thereby improving the heat dissipation efficiency of the connector.

16 Claims, 6 Drawing Sheets

CONNECTOR WITH HIGH HEAT DISSIPATION EFFICIENCY

BACKGROUND OF THE INVENTION

1. Field of the Invention

The present invention relates to an electronic connector, especially to a connector with a heat dissipating module.

2. Description of the Prior Arts

Due to the fast development of technologies such as 5G, AI, edge computing, TOT, etc., high-speed transmission for data is critical, and such transmission relies on specialized cables such as AOC (Active Optical Cable) or AEC (Active Ethernet Cable). However, during the transmission via the abovementioned specialized cables, the optical module or the IC generates high heat, which impacts the transmission speed. Therefore, the heat must be dissipated to ensure the performance.

A conventional method for cooling the optical module or the IC is applying a thermal paste or a thermal conductive sheet to the optical module or the IC, and making the thermal paste or the thermal conductive sheet contact a metal case to allow the optical module or the IC to transmit heat to the case to be cooled down.

Nevertheless, since the case must withstand external forces, the case must be made of a material having sufficient rigidity, which will lead to insufficient thermal conductivity of the material. Therefore, when the optical module or the IC transmits heat to the case, the heat can only be transmitted to an area of the case, i.e., where the thermal paste or the thermal conductive sheet contacts the case, but cannot be transmitted to other areas of the case through insufficient thermal conductivity of the case's own material. Eventually, due to the small heat transmission area, the efficiency of the heat dissipation is low.

To sum up, how to meet the heat dissipation requirements for high-speed transmission under standard specifications has become a major issue in the field of transmission cable technology.

To overcome the shortcomings, the present invention provides a connector with high heat dissipation efficiency to mitigate or obviate the aforementioned problems.

SUMMARY OF THE INVENTION

The main objective of the present invention is to provide a connector that can achieve a larger heat conducting area through a thermal diffusing unit, so the heat dissipation efficiency is higher.

The connector is adapted to be mounted in an electronic device along an inserting direction. The connector has a case, a circuit board, and a thermal diffusing unit. The case has an inner surface. The circuit board is mounted in the case and has a heating source. The thermal diffusing unit abuts the inner surface of the case and the heating source of the circuit board. An area of the thermal diffusing unit abutting the inner surface is bigger than an area of the thermal diffusing unit abutting the heating source. A heat transfer coefficient of the thermal diffusing unit is larger than a heat transfer coefficient of the case.

By means of the heat transfer coefficient of the material of the thermal diffusing unit being larger than the case, the thermal diffusing unit abutting both the inner surface of the case and the heating source of the circuit board, and the area of the thermal diffusing unit abutting the inner surface being bigger than the area of the thermal diffusing unit abutting the heating source, the thermal diffusing unit is allowed to transmit heat from a small area to a big area, thereby enlarging the heat conducting area of the heating source and improving the heat dissipation efficiency.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
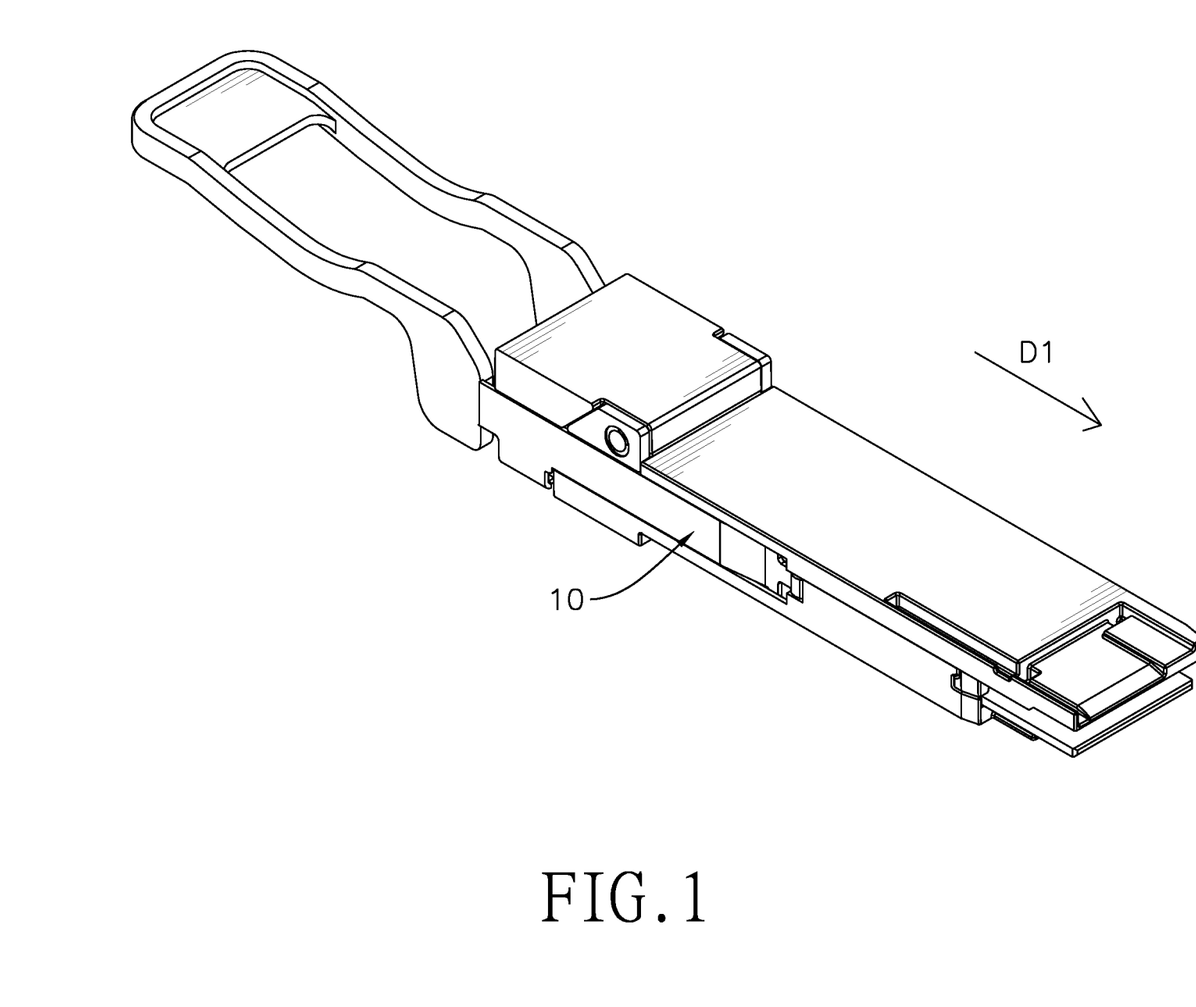
FIG. 1 is a perspective view of a first embodiment of a connector in accordance with the present invention.
Figure 2:
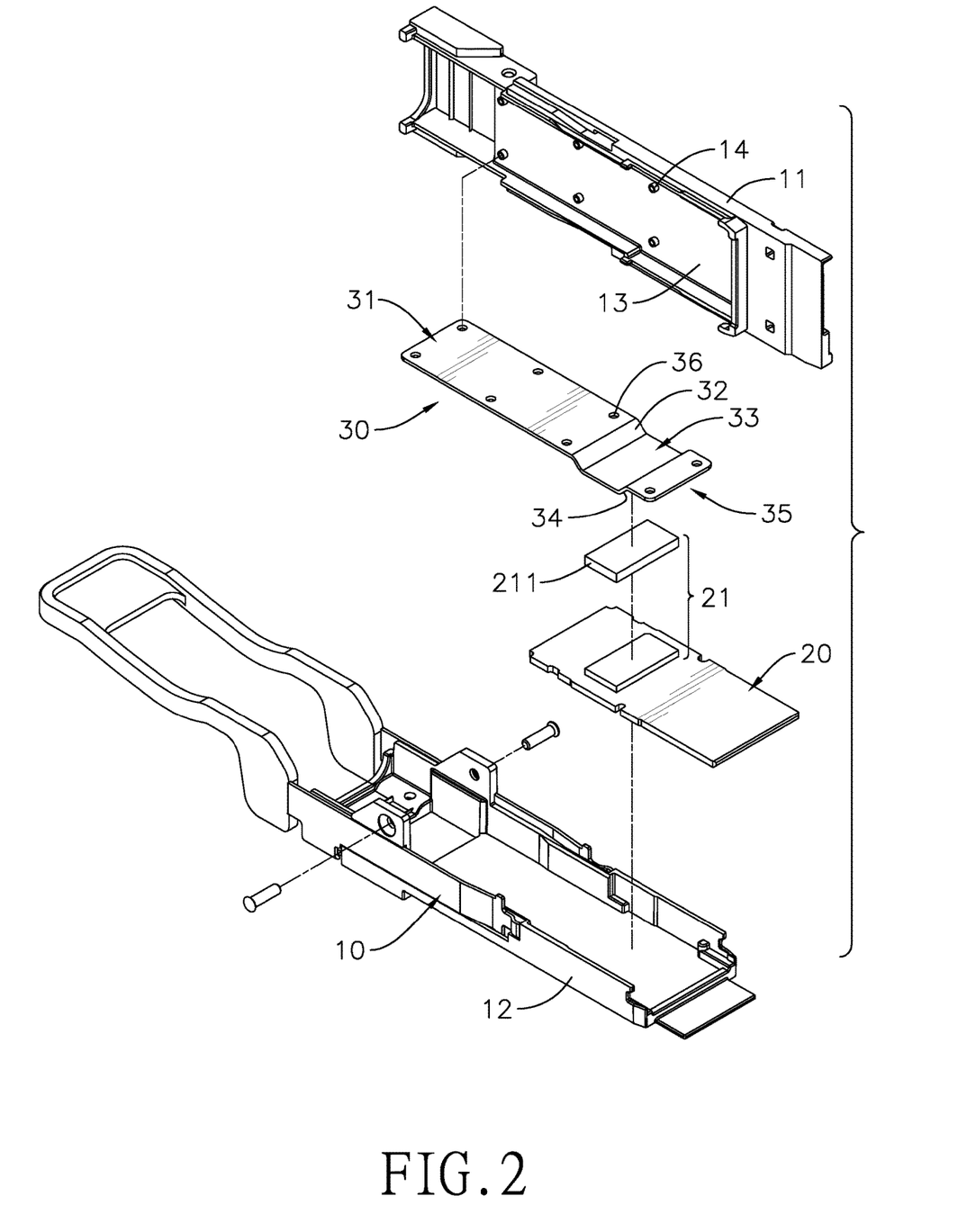
FIG. 2 is an exploded view of the first embodiment of the connector in FIG. 1.
Figure 3:
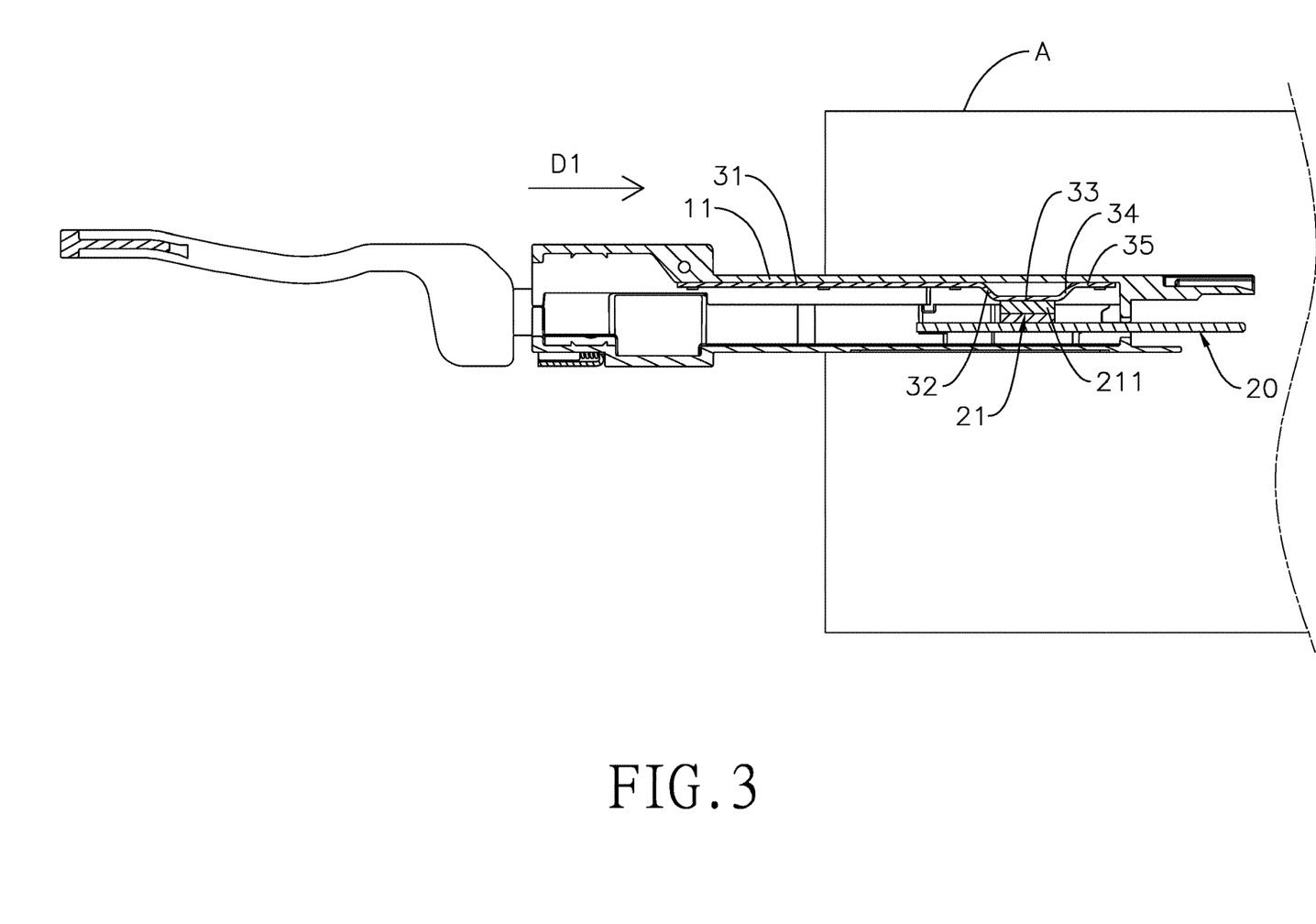
FIG. 3 is a side view in cross-section of the first embodiment of the connector in FIG. 1.

With reference to FIGS. 1, 2, and 3, a connector in accordance with the present invention is adapted to be mounted in an electronic device along an inserting direction. In the first embodiment, the connector comprises a case 10, a circuit board 20, and a thermal diffusing unit 30.

In the first embodiment, the case 10 can be formed by assembling a first shell 11 and a second shell 12. The case 10 has an inner surface 13.

The circuit board 20 is mounted in the case 10. In the first embodiment, the inner surface 13 is formed on the first shell 11, and the circuit board 20 is mounted on the second shell 12. The circuit board 20 has a heating source 21. Specifically, the heating source 21 can be any electric unit such as an optical module or an IC, and the heating source 21 comprises a thermal conductive sheet 211 or thermal paste in the first embodiment.

Figure 4:
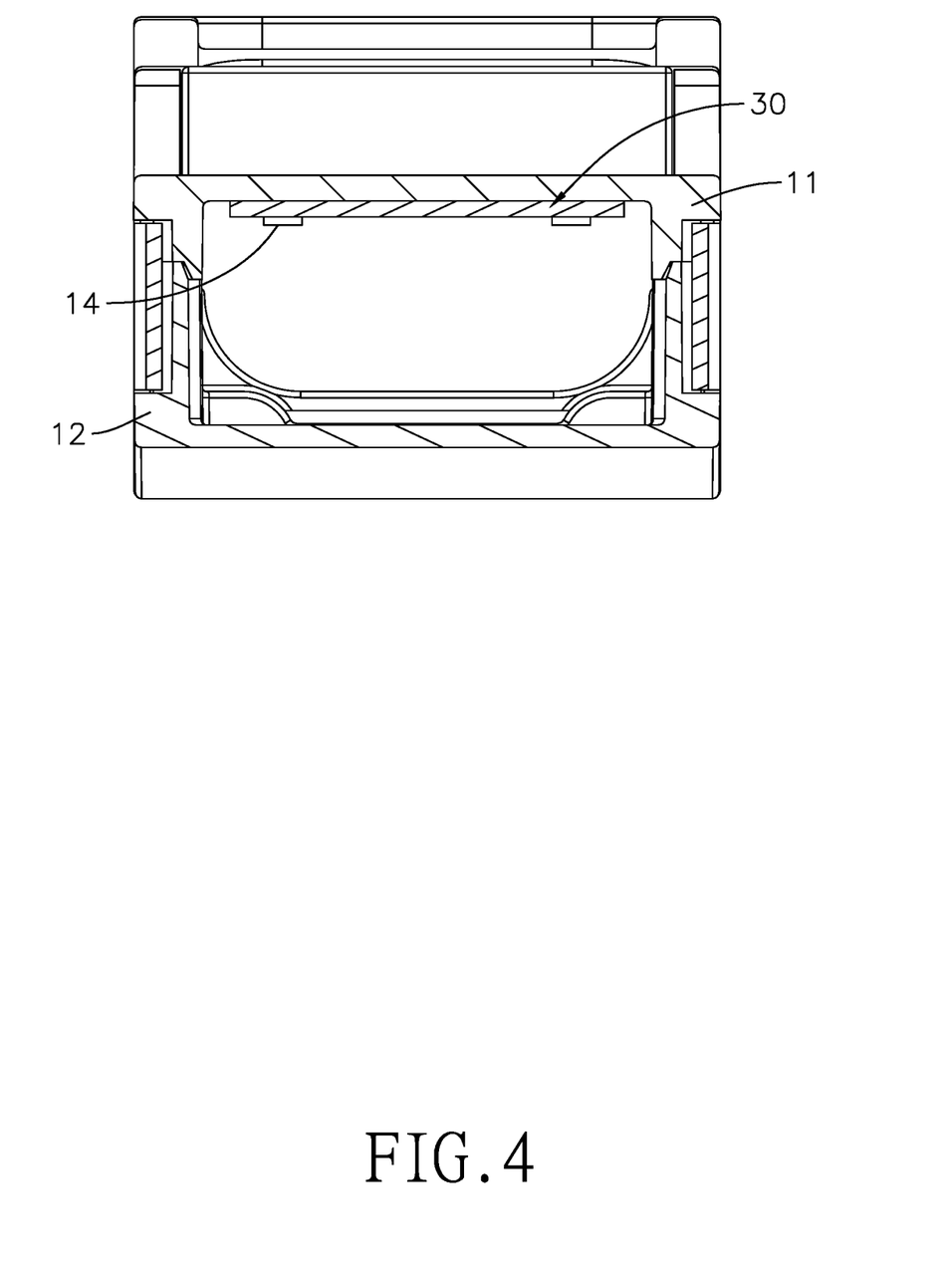
FIG. 4 is a front view in cross-section of the first embodiment of the connector in FIG. 1.

With further reference to FIGS. 3 and 4, the thermal diffusing unit 30 abuts the inner surface 13 of the case 10 and the heating source 21 of the circuit board 20. Specifically, the thermal diffusing unit 30 abuts the thermal conductive sheet 211 or the thermal paste of the heating source 21. An area of the thermal diffusing unit 30 abutting the inner surface 13 is bigger than an area of the thermal diffusing unit 30 abutting the heating source 21. A heat transfer coefficient of a material of the thermal diffusing unit 30 is larger than a heat transfer coefficient of the case 10. That is, the heat transfer coefficient of the thermal diffusing unit 30 makes the heat generated by the heating source 21 transmitted quickly and evenly to the thermal diffusing unit 30, and to the whole surface of the thermal diffusing unit 30. Therefore, further with the area of the thermal diffusing unit 30 abutting the inner surface 13 being bigger than the area of the thermal diffusing unit 30 abutting the heating source 21, the heat conducting area can be enlarged.

In the first embodiment, the thermal diffusing unit 30 is a board and has a first case segment 31, a first inclined segment 32, a heating source segment 33, a second inclined segment 34, and a second case segment 35 connected sequentially along the inserting direction D1. The first case segment 31 abuts the inner surface 13 of the case 10. The first inclined segment 32 is connected between the first case segment 31 and the heating source segment 33, and is inclined to the first case segment 31 and the heating source segment 33. The heating source segment 33 is connected between the first case segment 31 and the second case segment 35, and abuts the heating source 21. The second inclined segment 34 is connected between the heating source segment 33 and the second case segment 35, and is inclined to the heating source segment 33 and the second case segment 35. The second case segment 35 abuts the inner surface 13 of the case 10. Specifically, the heating source segment 33 has a first end and a second end being opposite to the first end. The first case segment 31 is connected to the first end of the heating source segment 33, and the second case segment 35 is connected to the second end of the heating source segment 33.

In addition, the first case segment 31 and the second case segment 35 are coplanar, but the heating source segment 33 and the first case segment 31 are noncoplanar, and a space is formed between the heating source segment 33 and the case 10. Further, the first inclined segment 32 and the second inclined segment 32 extend gradually away from each other in a direction from the heating source 21 toward the case 10. Moreover, a length of the first case segment 31 in the inserting direction D1 is larger than a length of the second case segment 35 in the inserting direction D1, and in the inserting direction D1, the second case segment 35 is located in front of the first case segment 31.

The structure of the thermal diffusing unit 30 is not limited to the abovementioned, as the first inclined segment 32 and the second inclined segment 34 can also extend gradually toward each other in the direction from the heating source 21 toward the case 10, or the first case segment 31, the second case segment 35, and the heating source segment 33 can also be located on a same imaginary plane, which means the heating source segment 33 abuts the case 10 and no space is formed between the heating source segment 33 and the case 10, or the thermal diffusing unit 30 can also be implemented without the first inclined segment 32 and the second inclined segment 34, but with two connecting segments which are perpendicular to the first case segment 31, the second case segment 35, and the heating source segment 33 and connecting the three segments 31, 33, 35. In other embodiments, the thermal diffusing unit 30 can even be implemented without the first case segment 31 or the second case segment 35. Besides, in the first embodiment, the thermal diffusing unit 30 is formed by bending a board in order to reduce manufacturing cost, but in another embodiment the thermal diffusing unit 30 is not limited to be formed by bending a board.

With further reference to FIG. 2, in the first embodiment, the thermal diffusing unit 30 has multiple through holes 36, and the case 10 has multiple assembling pins 14 formed on the inner space 13. The assembling pins 14 are respectively mounted in the through holes 36 so that the thermal diffusing unit 30 can be firmly mounted on the inner surface 13 of the case 10 via the assembling pins 14 and the through holes 36. But the way of assembling the thermal diffusing unit 30 and the case 10 is not limited to the abovementioned, as the thermal diffusing unit 30 can also be pasted to the inner surface 13 of the case 10 via the thermal conductive sheet 211 or the thermal paste. Alternatively, please refer to the second embodiment of the present invention.

Figure 5:
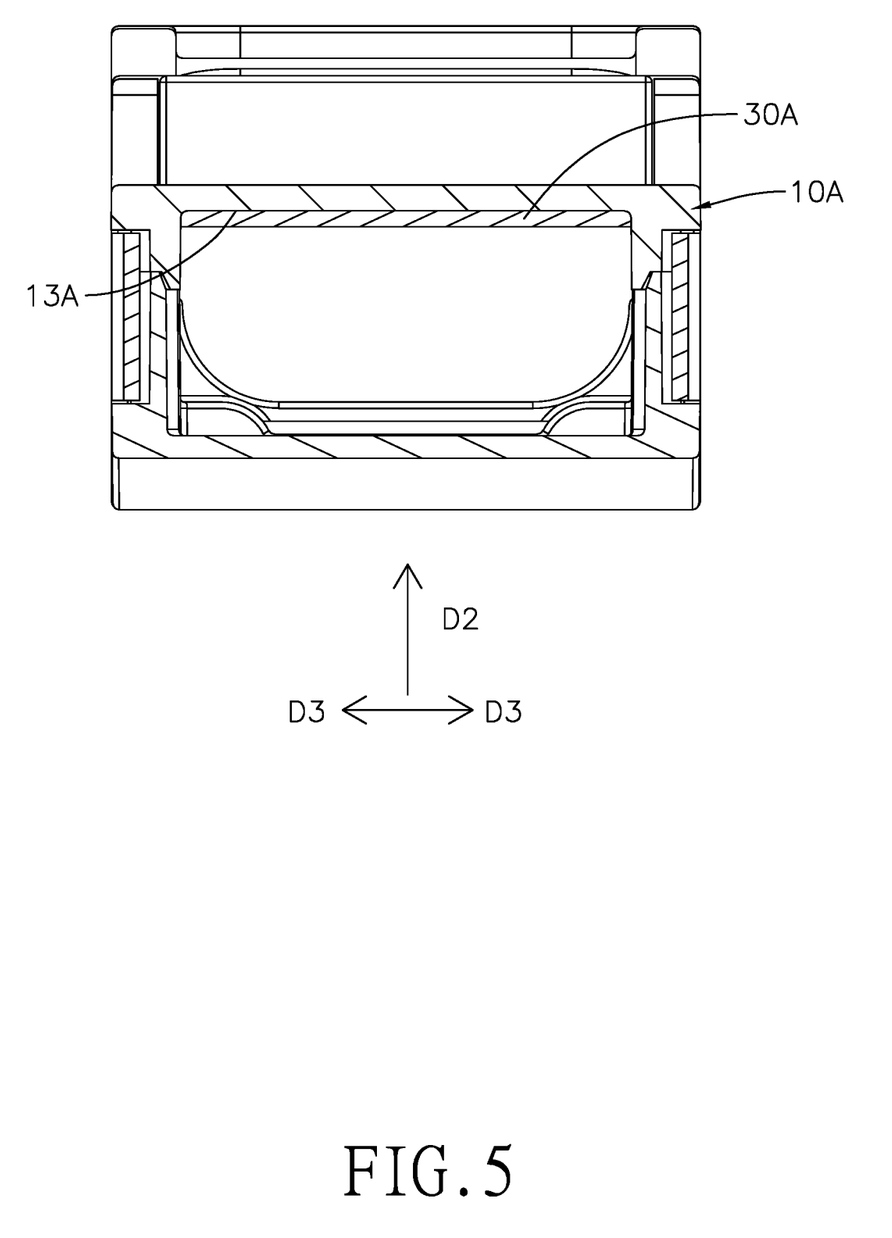
FIG. 5 is a front view in cross-section of a second embodiment of a connector in accordance with the present invention.

With further reference to FIG. 5, in the second embodiment, the connector further has an abutting direction D2 and two lateral directions D3. The thermal diffusing unit 30A abuts the inner surface 13A of the case 10A along the abutting direction D2. The two lateral directions D3 are opposite to each other, are perpendicular to the abutting direction D2, and are perpendicular to the inserting direction D1. Two edges, which are respectively located on the two lateral directions D3, of the thermal diffusing unit 30A abut the case 10A such that the case 10 clamps the thermal diffusing unit 30A. In other words, in the second embodiment, the thermal diffusing unit 30A has two side edges being opposite to each other, and the two side edges tightly abut the inner surface 13A of the case 10A.

Figure 6:
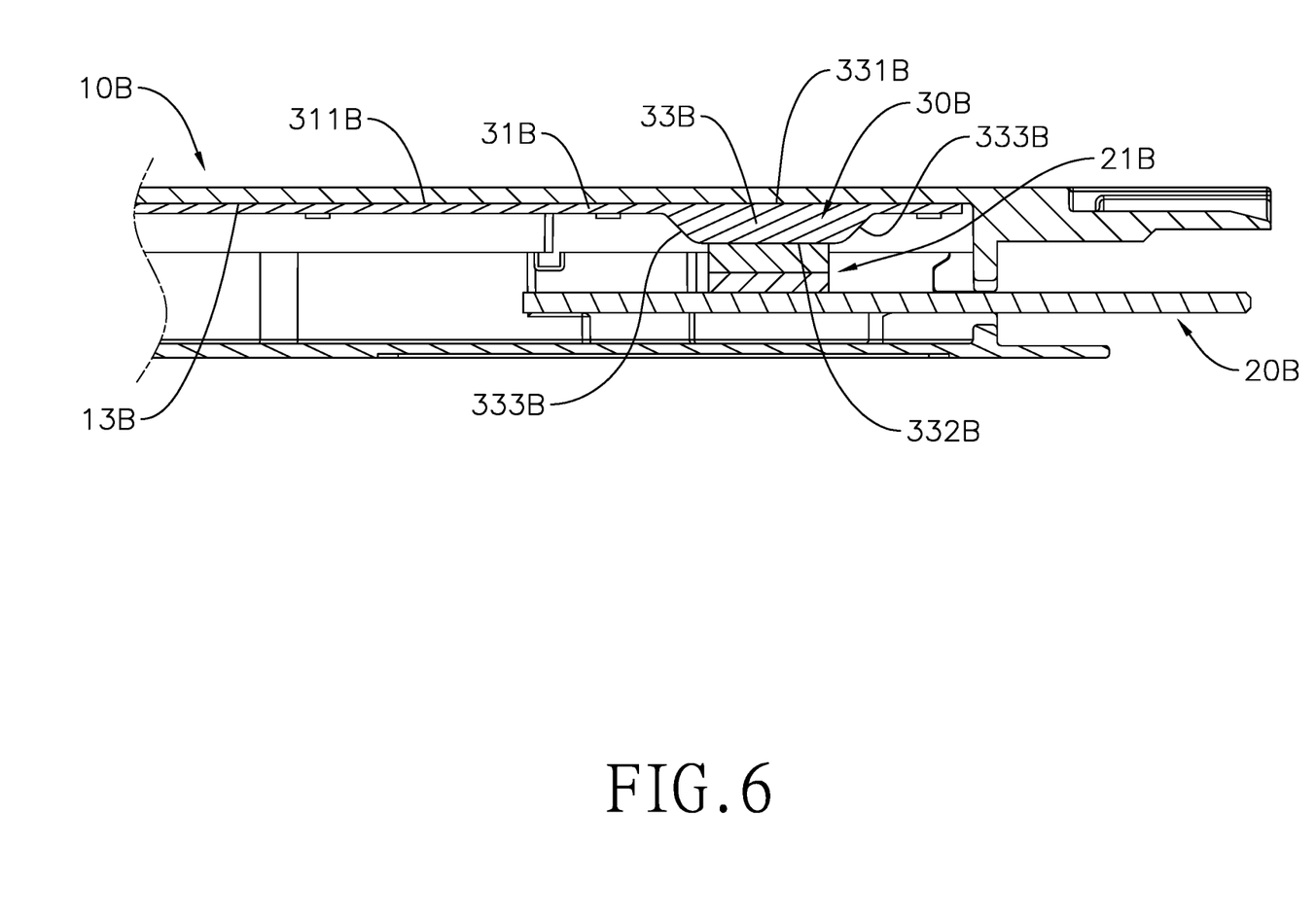
FIG. 6 is a side view in cross-section of a third embodiment of a connector in accordance with the present invention.

With further reference to FIG. 6, a structure of the third embodiment is basically the same as the first embodiment, while the difference is that the thermal diffusing unit 30B has a board segment 31B and a heating source segment 33B. The board segment 31B has an abutting surface 311B abutting the inner surface 13B of the case 10B. The heating source segment 33B is connected to the board segment 31B and has a first surface 331B and a second surface 332B. The first surface 331B abuts the inner surface 13B of the case 10B. The second surface 332B is opposite to the first surface 331B and abuts the heating source 21B of the circuit board 20B. Additionally, in the third embodiment, the heating source segment 33B has two connecting inclined surfaces 333B. The two connecting inclined surfaces 333B are connected to the second surface 332B of the heating source segment 33B and the board segment 31B, and the two connecting inclined surfaces 333B are inclined to the second surface 332B. Further, in the inserting direction D1, the two connecting inclined surfaces 333B are respectively located in a front side and a rear side of the second surface 332B. The two connecting inclined surfaces 333B extend gradually away from each other in a direction from the heating source 21B toward the case 10B. Moreover, the heating source segment 33B is solid, and is formed integrally with the board segment 31B, thereby transmitting heat more effectively.

By means of the heat transfer coefficient of the material of the thermal diffusing unit 30 being larger than that of the case 10, the thermal diffusing unit 30 abutting both the inner surface 13 of the case 10 and the heating source 21 of the circuit board 20, and the area of the thermal diffusing unit 30 abutting the inner surface 13 being bigger than the area of the thermal diffusing unit 30 abutting the heating source 21, the thermal diffusing unit 30 is allowed to transmit heat from a small area to a big area, thereby enlarging the heat conducting area of the heating source 21 and improving the heat dissipation efficiency.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A connector adapted to be mounted in an electronic device along an inserting direction; the connector comprising:
    a case having
        an inner surface;
    a circuit board mounted in the case and having
        a heating source; and a thermal diffusing unit abutting the inner surface of the case and the heating source of the circuit board; an area of the thermal diffusing unit abutting the inner surface being bigger than an area of the thermal diffusing unit abutting the heating source; a heat transfer coefficient of the thermal diffusing unit being larger than a heat transfer coefficient of the case, wherein the thermal diffusing unit has a board segment and a heating source segment;

the board segment has an abutting surface abutting the inner surface of the case;

the heating source segment is connected to the board segment; and the heating source segment has
- a first surface abutting the inner surface of the case, and
- a second surface opposite to the first surface, the second surface abutting the heating source of the circuit board.

2. The connector as claimed in claim 1, wherein
the heating source segment has
- a first end, and
- a second end opposite to the first end; and the thermal diffusing unit is a board and further has
- a first case segment abutting the inner surface of the case and connected to the first end of the heating source segment, and
- a second case segment abutting the inner surface of the case and connected to the second end of the heating source segment.

3. The connector as claimed in claim 2, wherein
the first case segment and the second case segment are coplanar; and the heating source segment and the first case segment are noncoplanar, and a space is formed between the heating source segment and the case.

4. The connector as claimed in claim 3, wherein the thermal diffusing unit further has
- a first inclined segment connected between the first case segment and the heating source segment, and inclined to the first case segment and the heating source segment; and
- a second inclined segment connected between the heating source segment and the second case segment, and inclined to the heating source segment and the second case segment.

5. The connector as claimed in claim 4, wherein the first inclined segment and the second inclined segment extend gradually away from each other in a direction from the heating source toward the case.

6. The connector as claimed in claim 2, wherein
- a length of the first case segment in the inserting direction is larger than a length of the second case segment in the inserting direction; and
- in the inserting direction, the second case segment is located in front of the first case segment.

7. The connector as claimed in claim 5, wherein
- a length of the first case segment in the inserting direction is larger than a length of the second case segment in the inserting direction; and
- in the inserting direction, the second case segment is located in front of the first case segment.

8. The connector as claimed in claim 1, wherein the heating source segment has
- two connecting inclined surfaces connected to the second surface; in the inserting direction, the two connecting inclined surfaces respectively located in a front side and a rear side of the second surface; the two connecting inclined surfaces extending gradually away from each other in a direction from the heating source toward the case.

9. The connector as claimed in claim 1, wherein
the thermal diffusing unit has
- multiple through holes; and the case has
- multiple assembling pins respectively mounted in the through holes.

10. The connector as claimed in claim 7, wherein
the thermal diffusing unit has
- multiple through holes; and the case has
- multiple assembling pins respectively mounted in the through holes.

11. The connector as claimed in claim 8, wherein
the thermal diffusing unit has
- multiple through holes; and the case has
- multiple assembling pins respectively mounted in the through holes.

12. The connector as claimed in claim 1, wherein
the connector further has
- an abutting direction; the thermal diffusing unit abutting the inner surface of the case along the abutting direction; and
- two lateral directions being opposite to each other, being perpendicular to the abutting direction, and being perpendicular to the inserting direction; and two edges, which are respectively located in the two lateral directions, of the thermal diffusing unit abut the case such that the case clamps the thermal diffusing unit.

13. The connector as claimed in claim 10, wherein
the connector further has
- an abutting direction; the thermal diffusing unit abutting the inner surface of the case along the abutting direction; and
- two lateral directions being opposite to each other, being perpendicular to the abutting direction, and being perpendicular to the inserting direction; and two edges, which are respectively located in the two lateral directions, of the thermal diffusing unit abut the case such that the case clamps the thermal diffusing unit.

14. The connector as claimed in claim 11, wherein
the connector further has
- an abutting direction; the thermal diffusing unit abutting the inner surface of the case along the abutting direction; and
- two lateral directions being opposite to each other, being perpendicular to the abutting direction, and being perpendicular to the inserting direction; and two edges, which are respectively located in the two lateral directions, of the thermal diffusing unit abut the case such that the case clamps the thermal diffusing unit.

15. A connector adapted to be mounted in an electronic device along an inserting direction; the connector comprising:
- a case having an inner surface;
- a circuit board mounted in the case and having a heating source; and a thermal diffusing unit abutting the inner surface of the case and the heating source of the circuit board; an area of the thermal diffusing unit abutting the inner surface being bigger than an area of the thermal diffusing unit abutting the heating source; a heat transfer coefficient of the thermal diffusing unit being larger than a heat transfer coefficient of the case, wherein:

the thermal diffusing unit is a board; the thermal diffusing unit has a heating source segment, a first case segment, and a second case segment; the heating source segment abuts the heating source; the heating source segment has a first end and a second end opposite to the first end; the first case segment abuts the inner surface of the case; the first case segment is connected to the first end of the heating source segment; the second case segment abuts the inner surface of the case; the second case segment is connected to the second end of the heating source segment.

16. A connector adapted to be mounted in an electronic device along an inserting direction; the connector comprising:

a case having an inner surface;

a circuit board mounted in the case and having a heating source;

a thermal diffusing unit abutting the inner surface of the case and the heating source of the circuit board; an area of the thermal diffusing unit abutting the inner surface being bigger than an area of the thermal diffusing unit abutting the heating source; a heat transfer coefficient of the thermal diffusing unit being larger than a heat transfer coefficient of the case, wherein the connector further has an abutting direction and two lateral directions; the thermal diffusing unit abuts the inner surface of the case along the abutting direction; the two lateral directions are opposite to each other; the two lateral directions are perpendicular to the abutting direction and the inserting direction; two edges, which are respectively located in the two lateral directions, of the thermal diffusing unit abut the case such that the case clamps the thermal diffusing unit.

* * * * *